United States Patent
Das et al.

(10) Patent No.: US 7,636,907 B1
(45) Date of Patent: Dec. 22, 2009

(54) BALANCING LOGIC RESOURCE USAGE IN A PROGRAMMABLE INTEGRATED CIRCUIT

(75) Inventors: Satyaki Das, Palo Alto, CA (US); Yu Hu, Los Angeles, CA (US)

(73) Assignee: Xilinx, Inc., San Jose, CA (US)

( * ) Notice: Subject to any disclaimer, the term of this patent is extended or adjusted under 35 U.S.C. 154(b) by 271 days.

(21) Appl. No.: 11/805,744

(22) Filed: May 24, 2007

(51) Int. Cl.
    *G06F 17/50* (2006.01)
(52) U.S. Cl. .................... 716/16; 716/6; 716/8; 716/9; 716/10; 716/11; 703/2
(58) Field of Classification Search .............. 716/6, 716/8–11, 16; 703/2
See application file for complete search history.

(56) References Cited

U.S. PATENT DOCUMENTS

| | | | |
|---|---|---|---|
| 6,871,336 B1 * | 3/2005 | Anderson | 716/9 |
| 2007/0150846 A1 * | 6/2007 | Furnish et al. | 716/8 |
| 2007/0220522 A1 * | 9/2007 | Coene et al. | 718/104 |
| 2008/0021679 A1 * | 1/2008 | Bleiweiss et al. | 703/2 |
| 2008/0216038 A1 * | 9/2008 | Bose | 716/8 |

OTHER PUBLICATIONS

Soheil Ghiasi et al.; "A Unified Theory of Timing Budget Management"; Copyright 2004 IEEE; pp. 653-659.

* cited by examiner

*Primary Examiner*—Naum B Levin
(74) *Attorney, Agent, or Firm*—Kevin T. Cuenot; Lois D. Cartier

(57) ABSTRACT

A computer-implemented method of balancing logic resource usage in a circuit design for a programmable logic device (PLD) can include determining that an assignment of elements of the circuit design to a first type of logic resource of the PLD is unbalanced compared to an assignment of elements of the circuit design to an alternate type of logic resource of the PLD. An Integer Linear Programming (ILP) formulation specifying a balanced assignment of elements to the first and alternate types of logic resources can be generated. A solution for the ILP formulation can be obtained. Selected elements of the circuit design can be re-mapped from the first type of logic resource to the alternate type of logic resource according to the solution of the ILP formulation and the circuit design specifying the re-mapped elements can be output.

16 Claims, 3 Drawing Sheets

BALANCING LOGIC RESOURCE USAGE IN A PROGRAMMABLE INTEGRATED CIRCUIT

FIELD OF THE INVENTION

The invention relates to integrated circuit devices (ICs). More particularly, the invention relates to balancing logic resource usage in a programmable logic device type of IC.

BACKGROUND

Programmable logic devices (PLDs) are a well-known type of integrated circuit that can be programmed to perform specified logic functions. One type of PLD, the field programmable gate array (FPGA), typically includes an array of programmable tiles. Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

FPGAs typically have different types of logic resources available within programmable tiles that can be used to implement the same logic functionality. These different types of logic resources, however, may have different delay characteristics making one type of logic resource capable of performing the logical function faster than the other. As such, the type of logic resource having the lowest delay would, in many cases, be preferable. This can lead to an unbalanced situation in which an Electronic Design Automation (EDA) tool maps a larger number of elements of a circuit design to the faster type of logic resource.

In cases where usage of one type of logic resource is unbalanced with respect to another, the resulting circuit implementation within the FPGA may require an increased number of slices. (A slice is a type of logic block that includes multiple types of logic resources). Using more slices for a circuit implementation can lead to longer wire-lengths and, therefore, a potentially slower circuit. In other cases, the FPGA simply may not have a sufficient number of the logic resources of the preferred type to accommodate each circuit element that is to be mapped to that type of logic resource.

Therefore, it is desirable to provide methods of balancing logic resource usage within an FPGA or other type of PLD.

SUMMARY

The present invention relates to balancing logic resource usage in a programmable logic device (PLD). One embodiment of the present invention can include a computer-implemented method of balancing logic resource usage in a circuit design for a PLD. The method can include determining that an assignment of circuit elements of the circuit design to a first type of logic resource of the PLD is unbalanced when compared to an assignment of circuit elements of the circuit design to an alternate type of logic resource of the PLD. An Integer Linear Programming (ILP) formulation specifying a balanced assignment of circuit elements to the first and alternate types of logic resources can be generated. The method also can include obtaining a solution for the ILP formulation, re-mapping selected circuit elements of the circuit design from the first type of logic resource to the alternate type of logic resource according to the solution of the ILP formulation, and outputting the circuit design specifying the re-mapped circuit elements.

Determining that an assignment of circuit elements is unbalanced can include determining that a measure of usage of logic resources of the first type exceeds a measure of usage of logic resources of the alternate type. The method can include restricting the first type of logic resource and the alternate type of logic resource to types of logic resources found within a same slice of the PLD.

In one embodiment, circuit elements of the circuit design can be first mapped to logic resources of the PLD. The method can include packing mapped circuit elements of the circuit design into slices of the PLD. Circuit elements assigned to logic resources of the first type that also are assigned to slices including at least one unused logic resource of the alternate type can be identified. The circuit elements considered for re-mapping in the ILP formulation can be limited to only those circuit elements identified in the prior step.

Generating an ILP formulation can include representing the circuit design as a directed acyclic graph (DAG) wherein nodes of the DAG represent circuit elements of the circuit design, defining an arrival time variable for each of a plurality of nodes of the DAG, and defining a timing slack budget variable for each of the plurality of nodes of the DAG. A binary variable for each of the plurality of nodes of the DAG also can be defined. The binary variable for each node can indicate whether the node is to be re-mapped to the first type of logic resource or the alternate type of logic resource.

Generating an ILP formulation also can include defining a constraint that depends upon a difference between a delay of the alternate type of logic resource and the first type of logic resource. Arrival time constraints, slack budget constraints, and critical path constraints also can be generated.

Generating an ILP formulation further can include defining a plurality of variables comprising binary variables, a plurality of constraints specifying relationships among selected ones of the plurality of variables, and an objective function to be minimized. The objective function can depend upon a sum of selected ones of the binary variables. Each binary variable can indicate whether an element of the circuit design is to be re-mapped to the first type of logic resource or the alternate type of logic resource.

Another embodiment of the present invention can include a computer-implemented method of balancing logic resource usage in a circuit design for a PLD. The method can include determining that an assignment of circuit elements of the circuit design to a first type of logic resource of the PLD is unbalanced when compared to an assignment of circuit elements of the circuit design to an alternate type of logic resource of the PLD and defining a plurality of variables for circuit elements of the circuit design assigned to the first type of logic resource and the alternate type of logic resource. The plurality of variables can include a plurality of binary variables, wherein each binary variable can indicate whether the associated circuit element is to be re-assigned to the first type of logic resource or the alternate type of logic resource.

The method further can include defining a plurality of constraints specifying relationships among selected ones of the plurality of variables and obtaining values for the plurality of variables according to the plurality of constraints by minimizing a function that depends upon a sum of the plurality of binary variables. The method also can include re-assigning circuit elements of the circuit design to the first type of logic resource or the alternate type of logic resource according to the values determined for the plurality of binary variables. The circuit design specifying the re-assigned circuit elements can be output.

The method can include restricting the first type of logic resource and the alternate type of logic resource to types of logic resources found within a same slice of the PLD.

In one embodiment, the method can include first mapping logic elements of the circuit design to logic resources of the PLD and packing mapped circuit elements of the circuit design into slices of the PLD. Circuit elements assigned to logic resources of the first type that also are assigned to slices including at least one unused logic resource of the alternate type can be identified. The circuit elements for which the plurality of variables is defined and that are considered for re-assigning can be limited to only those circuit elements identified as being assigned to logic resources of the first type that also are assigned to slices including at least one unused logic resource of the alternate type.

In another embodiment, the method can include identifying circuit elements assigned to logic resources of the first type that have a low affinity with circuit elements assigned to logic resources of the alternate type. The circuit elements for which the plurality of variables is defined and that are considered for re-assigning can be limited to only those circuit elements identified as having a low affinity with circuit elements assigned to logic resources of the alternate type.

Yet another embodiment of the present invention can include a computer program product including a computer-usable medium having computer-usable program code that, when executed by an information processing system, causes the information processing system to perform the various steps and/or functions disclosed herein.

DETAILED DESCRIPTION OF THE DRAWINGS

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to balancing logic resource usage on a programmable logic device (PLD). When implementing a circuit design using a PLD, for example, a field programmable gate array (FPGA), the circuit design is mapped and packed into slices that are available on the particular type of PLD in which the circuit design will be implemented (the "target PLD"). In accordance with the embodiments disclosed herein, the assignment of elements of the circuit design to particular types of logic resources, e.g., mapping or technology mapping, can be evaluated to determine whether logic resource balancing is needed. The degree to which selected types of logic resources are used by the circuit design can be evaluated and/or compared.

When logic resource balancing is needed, an Integer Linear Programming (ILP) formulation of the logic resource balancing problem can be generated. ILP refers to determining values for a plurality of variables by solving a series of linear equations. The ILP formulation seeks to reach a usage balance between a plurality of different types of logic resources and, particularly, between different types of logic resources that can be configured to perform the same logical functionality. The ILP formulation can be solved. The solution can indicate the type of logic resource to which each circuit element should be re-assigned. Some circuit elements can be re-assigned to the same type of logic resource to which the circuit elements were assigned prior to the ILP solution. Other circuit elements can be re-assigned to a different type of logic resource. An updated circuit design can be output that specifies the re-assigned or re-mapped circuit elements to available types of logic resources.

Figure 1:
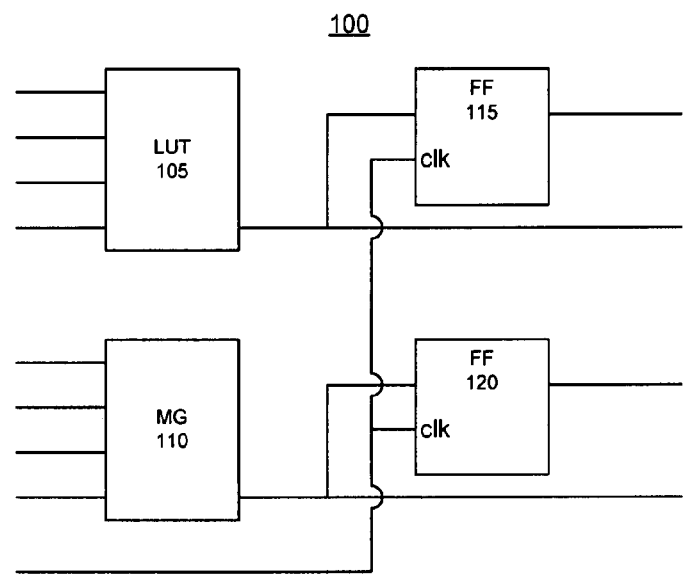
FIG. 1 is a block diagram illustrating an example of a slice of a programmable logic device (PLD) which is useful for understanding the embodiments disclosed herein.

FIG. 1 is a block diagram illustrating an example of a slice 100 of a PLD which is useful for understanding the embodiments disclosed herein. The slice 100, for example, can be a slice that is available within a configurable logic block (CLB) of an FPGA. A "CLB," as used herein, can refer to one variety of a programmable tile of an FPGA. A CLB can be subdivided into one or more units of programmably configurable circuitry known as "slices." A plurality of slices may be disposed in each CLB, with one or more arrays of CLBs forming at least part of the programmably configurable circuitry of the FPGA.

As pictured in FIG. 1, the slice 100 can include a plurality of different types of logic resources. For example, the slice 100 can include a lookup table (LUT) 105 type of logic resource and a macro gate (MG) 110 type of logic resource. The slice 100 further can include a flip-flop (FF) 115 and an FF 120. The functionality of a LUT is well established. An MG is a type of fixed gate having limited configurability, for example, as compared to the LUT 105. The MG 110, however, has a lower delay than the LUT 105 and is, therefore, faster.

The slice 100 depicted in FIG. 1 is presented to illustrate various aspects of the embodiments disclosed herein. It should be appreciated, however, that more or less complex slices, e.g., slices with more or fewer logic resources, can be used. Such slices further may have the same types of logic resources as slice 100 or different types of logic resources.

Within slice 100, the LUT 105 and the MG 110 can be said to be alternates of one another. For example, the MG 110 can be configured to implement a logical function in an efficient manner. The LUT 105 can be configured to implement the same logical function as the MG 110. While the LUT 105 can perform the same logical function as the MG 110, the LUT 105 has a larger delay. As a result, the signal path utilizing the LUT 105 will incur a larger delay than had the signal path used the MG 110 in place of the LUT 105.

In general, two types of logic resources can be said to be "alternates" of one another if the two types of logic resources can be configured to perform the same logical function. Further, the two different types of logic resources must be located, or available, within a same slice. It should be appreciated that alternate logical resources need not have different delay characteristics, although differing delay characteristics may be the case more often than not.

Figure 2:
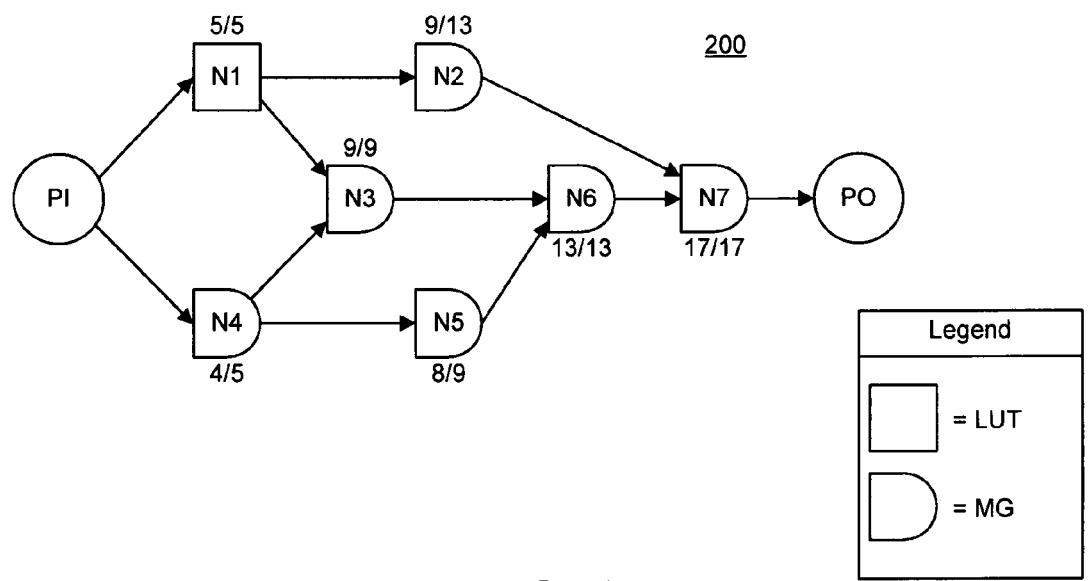
FIG. 2 is a directed acyclic graph (DAG) representing a circuit design which is useful for understanding the embodiments disclosed herein.

FIG. 2 is an example of a directed acyclic graph (DAG) 200 which is useful for understanding the embodiments disclosed herein. As is well known, a circuit design, or a portion of a circuit design, can be represented as a DAG in which circuit elements can be represented as nodes of the DAG. Thus, the DAG 200 can represent a circuit design, or a portion of a circuit design, to be implemented in a target PLD. In this case, the DAG 200 can include a primary input labeled "PI" and a primary output labeled "PO." A "primary input," as used herein, can refer to a reference node in which the signal arrival time for that node is 0. The primary input further can be a node of the DAG 200 that only has paths leaving the node, with no paths entering. The "primary output," as used herein, can refer to a node of the DAG at which the signal arrival time can be represented as the critical path delay. The primary output can be a node of the DAG 200 that only has paths entering, with no paths leaving.

A plurality of nodes labeled N1-N7 can be disposed between the primary input and the primary output. Each of the nodes N1-N7 of the DAG 200 can represent an element of a circuit design that can be technology mapped to a particular type of logic resource. In this case, the shape of each node in the DAG 200 illustrates the type of logic resource to which that node (e.g., the circuit element of a circuit design represented by the node) has been mapped or assigned. In the pictured embodiment, node N1 has been mapped to a LUT. Nodes N2-N7 have been mapped to MGs.

Referring again to the slice architecture illustrated in FIG. 1, it can be seen that the DAG 200, as currently mapped, would require 6 slices of the PLD for implementation. Since the DAG 200 includes 7 nodes, and each slice includes only one type of each logic resource, e.g., one LUT and one MG, 6 slices are needed. Within one slice, both the LUT and the MG will be used. Within the other 5 slices, only an MG will be used. The DAG 200 illustrates that, at least in this case, MGs are utilized to a greater extent than LUTs. This may be the case since an Electronic Design Automation (EDA) tool will likely favor mapping circuit elements to faster logic resource types when available.

The usage of logic resources by the circuit design represented by DAG 200 can be said to be "unbalanced." Usage of logic resources of the PLD by the circuit design can be said to be unbalanced when a measure of usage of logic resources of a first type exceeds a measure of usage of logic resources of a second, or alternate, type. A "used" type of logic resource refers to a particular logic resource of a specified type on the PLD to which a circuit element of the circuit design has been mapped or assigned.

In one embodiment, the measure of logic resource usage of logic resources of the first type can be determined as a ratio or fraction by dividing the number of used logic resources of the first type by the number of available logic resources of the first type on the PLD. Similarly, the measure of logic resource usage of logic resources of the second type can be determined as a ratio or a fraction by dividing the number of used logic resources of the second type by the number of available logic resources of the second type on the PLD.

In illustration, if a PLD has, for example, 200 LUTs and 100 MGs, with 100 LUTs and 50 MGs being used by the circuit design, the usage of LUTs as compared to MGs would be equal. The measure of logic resource usage for each type of logic resource is 0.5. The circuit design, in this case, is not considered unbalanced.

In another embodiment, a threshold can be applied to determine whether the circuit design is unbalanced. For example, a ratio of the two measures of logic resource usage can be taken. If the ratio is greater than a threshold value, the circuit design can be considered unbalanced. In another example, one measure may need to exceed the other by a predetermined amount for the circuit design to be considered unbalanced.

In another embodiment, the logic resource usage can be said to be unbalanced when the number of used logic resources of one type exceeds the number of used logic resources of an alternate type. It should be appreciated that this embodiment can be viewed as a special case where the number of available logic resources of the first and alternate types on the PLD is equivalent. As noted, thresholds can be applied. For example, logic resource usage can be said to be unbalanced when the number of used logic resources of one type exceeds the number of used logic resources of an alternate type by a predetermined number, percentage, or other metric. With respect to DAG 200, the ratio of MGs to LUTs is 6:1 and can be considered unbalanced. The DAG 200 assumes slices having one MG and LUT and, therefore, a PLD having equal numbers of LUTs and MGs.

Listed above or below nodes N1-N7, signal arrival time and signal requirements are specified. For example, "9/13" is listed above node N2. The first number, in this case 9, is the signal arrival time at node N2. The second number, in this case 13, indicates the required signal arrival time at node N2. The times can be specified in terms of the primary input PI having a reference arrival time of zero and the primary output PO having an arrival time that does not exceed the critical path delay for the circuit. These values will be used in the ILP formulation to be described herein in further detail to ensure that a re-mapping of a circuit element from one type of logic resource to another does not result in a violation of a timing constraint of the circuit design.

Figure 3:
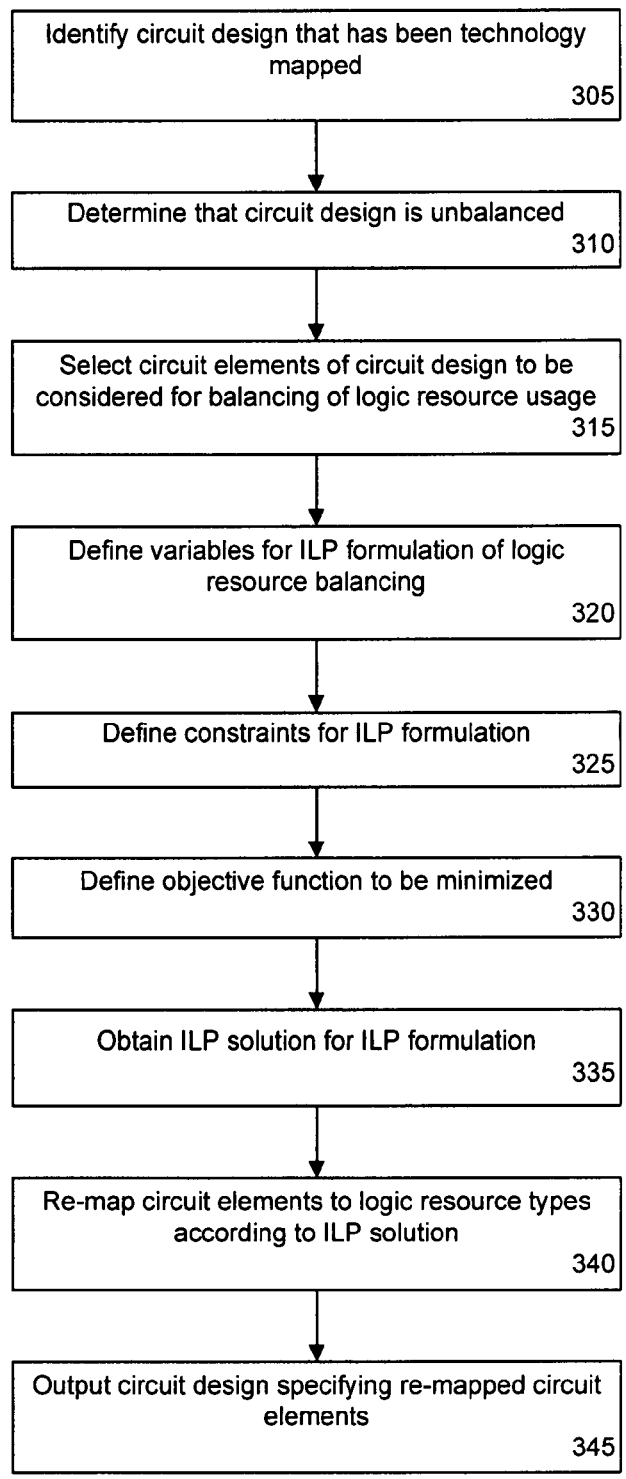
FIG. 3 is a flow chart illustrating a method of balancing logic resource usage of a PLD in accordance with one embodiment of the present invention.

FIG. 3 is a flow chart illustrating a method 300 of balancing logic resource usage of a PLD in accordance with one embodiment of the present invention. The method 300 can begin in a state in which a circuit design to be implemented within a PLD, for example, an FPGA, has been technology mapped. That is, the various elements of the circuit design can be assigned to particular logic resource types available on the target PLD. The circuit design also may be represented as a DAG or in another programmatic form that allows the technology mapped circuit design to be processed and/or analyzed.

In one embodiment, the method 300 can be implemented by an EDA tool, e.g., one capable of processing a programmatic description of a circuit for implementation within a PLD. Accordingly, in step 305, a circuit design that has been technology mapped can be identified. For example, such a circuit design can be loaded into an EDA tool for processing. In step 310, a determination can be made that the circuit design is unbalanced. That is, the EDA tool can determine that logic resource usage of one type of logic resource, e.g., a first type, is not balanced when compared to logic resource usage of a second, or alternate, type of logic resource. As noted, alternate types of logic resources can be logic resources that are, at least in some cases, functionally equivalent and available within a single slice.

In step 315, circuit elements of the circuit design can be selected for balancing of logic resource usage. In one embodiment, each circuit element assigned to a logic resource of the first type and each circuit element assigned to a logic resource of the alternate type can be selected for balancing of logic resource usage, e.g., to be considered for re-mapping within the ILP formulation.

In another embodiment, a filtering process can be applied to reduce the number of circuit elements that are considered for logic resource balancing, e.g., used within the ILP formulation. In one embodiment, the circuit design can be packed into slices of the target PLD. Packing the circuit design provides a way of filtering, or reducing, the number of circuit elements and assigned logic resource types that will be considered or processed during the ILP formulation and solution steps. In larger circuit designs, the size of the ILP formulation can be so large that ILP solvers are unable to determine a solution. By packing the circuit design, the EDA tool can generate a reduced set of circuit elements and logic resource types to be used in the ILP formulation, thereby increasing the likelihood of solving the ILP formulation.

For example, the EDA tool can limit the circuit elements that are to be considered when balancing logic resource usage. The EDA tool can identify circuit elements that have been assigned to logic resources of the first type that also are assigned to slices that include at least one unused logic resource of the alternate type. Such slices can be considered to be "sparsely utilized" slices. It should be appreciated that the threshold for determining that a slice is sparsely utilized can be selected to be two unused logic resources, three, etc. Such a determination may vary, for example, according to the size of the slice. Accordingly, the circuit elements considered for logic resource balancing within the ILP formulation can be limited to only those circuit elements that have been identified as being assigned to logic resources of the first type that also are assigned to slices that have been determined to be sparsely utilized.

In step 320, the variables for the ILP formulation of logic resource balancing can be defined. Variables for the ILP formulation can be determined only for those circuit elements or nodes selected in step 315. A variable $a_i$ can be defined for each node, e.g., circuit element, to be processed. The variable $a_i$ can indicate the arrival time of a signal at a given node i. A variable $b_i$ can be defined for each node to be processed. The variable $b_i$ can indicate the timing slack budget of a given node i. As used herein, the "timing slack budget" of a node i can refer to the amount of time by which a signal can be further delayed in arriving at node i without exceeding the timing requirements for node i assuming a current signal arrival time for node i and a current technology mapping of the circuit design.

A binary variable $m_i$ can be defined for each node to be processed. The binary variable $m_i$ can indicate the particular type of logic resource to which a circuit element is to be re-assigned or re-mapped. For example, with reference to LUTs and MGs, a value of 0 for the variable $m_i$ for node i can indicate that node i will be re-mapped to an MG. A value of 1 for the variable $m_i$ for node i can indicate that node i will be re-mapped to a LUT. LUTs and MGs are used throughout the description of FIG. 3 for purposes of illustration only. It should be appreciated that different types of logic resources can be used in place of LUTs and MGs when performing logic resource balancing as described herein.

In step 325, constraints for the ILP formulation can be defined. An arrival time constraint can be formulated. The arrival time constraint can be defined as $a_i + d_j + b_j \leq a_j$ for each edge (i, j). As is well known, an edge corresponds to the path or line linking two nodes i and j within a DAG representation of a circuit design. A timing slack budget constraint can be defined to ensure that the timing slack budget of each node is nonnegative. This constraint can be defined as $b_i \geq 0$, for each node i.

A critical path delay constraint can be defined to preserve the critical path delay of the circuit. This constraint can be defined as $a_{PO} \leq T$, where T is the path delay for the critical path, e.g., from the primary input to the primary output, and $a_{PO}$ represents the arrival time of a signal at the primary output. A reference arrival time constraint can be defined to ensure that the timing measurements are made according to a correct and stable reference. The reference arrival time constraint can be defined as $a_{PI} = 0$. That is, the arrival time of a signal at the primary input can be set to a timing reference of 0.

Another constraint can be defined which establishes a relationship between the timing slack budget and the re-mapping of nodes to different or same types of logic resources. This constraint can be defined as $(D_{LUT} - D_{MG}) * m_i \leq b_i$, where $D_{LUT}$ represents the delay of a LUT, $D_{MG}$ represents the delay of an MG, and $m_i$ is the binary variable corresponding to a selected node i that is set to 0 or 1 according to whether the node is re-mapped to a LUT or a MG. As noted, the term $b_i$ represents the timing slack budget of node i. This constraint ensures that the re-mapping of a node to a different type of logic resource will not cause the timing slack budget to be exceeded, thereby resulting in a timing failure of the resulting circuit implementation within the PLD.

In step 330, an objective function can be defined. In one embodiment, the objective function can be defined as $\min |m_n + m_{n-1} + \ldots + m_{n-(n-2)} - (n/2)|$. Within the objective function, the term n represents the total number of nodes being processed. The objective function imposes a relationship that results in the balancing of logic resource usage between a first type of logic resource and an alternate type of logic resource.

In step 335, an ILP solution for the ILP formulation can be obtained. In one embodiment, an ILP solver can be included as a component of an EDA tool such that the EDA tool can obtain a solution by solving the ILP formulation. In that case, in step 335, the EDA tool can calculate a solution for the ILP formulation. In another embodiment, the ILP solution can be obtained from an ILP solver that is separate from the EDA tool. For example, the EDA tool, having generated the ILP formulation, can output the ILP formulation to an ILP solver. The ILP solver can solve the ILP formulation and provide the solution, e.g., results, back to the EDA tool as output. In that case, the ILP solution can be obtained in step 335 from a separate ILP solver component. It should be appreciated that the exportation of the ILP formulation and importation of the ILP solution can be performed automatically without manual intervention or in a manual nature.

In any case, the solution to the ILP formulation can specify values for the variables described herein, as well as for the binary variable $m_i$ for each respective node i. As noted, the value of $m_i$ for a given node i indicates the particular type of logic resource to which the circuit element, or node, is to be re-mapped to obtain a more balanced circuit implementation in terms of logic resource usage.

In step 340, circuit elements, or nodes, can be re-assigned, or re-mapped as the case may be, to the types of logic resources indicated by the solution to the ILP formulation. It should be appreciated that in cases where a circuit element is re-mapped or re-assigned to a same type of logic resource type, the circuit element need not be literally re-mapped or re-assigned. For example, the circuit element can be skipped or ignored such that the original mapping is left intact or unchanged. In that case, the circuit element can still be considered "re-mapped" or "re-assigned".

In step 345, the updated circuit design specifying the re-mapped circuit elements can be output. As used herein, "outputting" or "output" can mean, without limitation, writing to a file, writing to a user display or other output device, playing audible notifications or providing other physical feedback to a user, sending or transmitting to another system, exporting, or the like. The entire resulting circuit design, with one or more circuit elements being re-mapped, can be packed, or re-packed, as the case may be, and undergo the remaining stages of implementation, e.g., routing and optimization.

To better illustrate the logic resource balancing embodiments disclosed herein, consider again the exemplary slice architecture of FIG. 1 and the exemplary DAG circuit representation of FIG. 2. The slice architecture of FIG. 1 included one LUT and one MG. The DAG of FIG. 2 utilized one LUT and 6 MGs, requiring 6 slices. Based upon the DAG shown, the slice architecture, and the ILP formulation described in FIG. 3, arrival time constraints can be defined as listed below.

edge (PI→N1): $a_{PI}+5+b_1 \leq a_1$
edge (PI→N4): $a_{PI}+4+b_4 \leq a_4$
edge (N1→N2): $a_1+4+b_2 \leq a_2$
edge (N1→N3): $a_1+4+b_3 \leq a_3$
edge (N4→N3): $a_4+4+b_3 \leq a_3$
edge (N4→N5): $a_4+4+b_5 \leq a_5$
edge (N2→N7): $a_2+4+b_7 \leq a_7$
edge (N3→N6): $a_3+4+b_6 \leq a_6$
edge (N5→N6): $a_5+4+b_6 \leq a_6$
edge (N6→N7): $a_6+4+b_7 \leq a_7$
edge (N7→PO): $a_7 \leq PO$ (the delay and budget of PO both are 0)

The timing slack budget constraints listed below can be generated to ensure that the timing slack budget is nonnegative.

$b_1 \leq 0$
$b_2 \leq 0$
$b_3 \leq 0$
$b_4 \leq 0$
$b_5 \leq 0$
$b_6 \leq 0$
$b_7 \leq 0$ The critical path delay can be preserved by defining the constraint $a_{PO} \leq T$. The reference arrival time can be set according to the arrival time constraint $a_{PI}=0$.

Relationships between the timing slack and the re-mapping of nodes to types of logic resources can be established through the constraints listed below. In this example, the term "(5-4)" represents the subtraction of the delay of a MG (4) from the delay of a LUT (5).

$(5-4)^*m_1 \leq b_1$
$(5-4)^*m_2 \leq b_2$
$(5-4)^*m_3 \leq b_3$
$(5-4)^*m_4 \leq b_4$
$(5-4)^*m_5 \leq b_5$
$(5-4)^*m_6 \leq b_6$
$(5-4)^*m_7 \leq b_7$, where $m_1, \ldots, m_7 = \{0,1\}$ Since the slice architecture has one LUT and one MG, it can be assumed that the fabric of the target PLD has an equal number of LUTs and MGs. Accordingly, an ideal balance of logic resource usage would be a number of MGs of n/2=7/2, where n is the number of circuit elements being processed in the ILP formulation. The objective of balancing logic resource usage of LUTs with MGs can be achieved through the minimization of the objective function, which was expressed as $\min|m_n+m_{n-1} \ldots +m_{n-(n-2)}-(n/2)|$. With respect to the example disclosed herein, this can be rewritten as $m_7+m_6+m_5+m_4+m_3+m_2-7/2 \leq t$, where $t \geq 0$.

These relationships and/or constraints can be provided as input to an ILP solver. ILP solvers typically are implemented as a computer program executing within a suitable information processing system. Available ILP solvers can include, but are not limited to, LP_Solve, which is a free solver, and the solver available under the GNU Scientific Library. Other commercial solvers also are available and are well known to the skilled artisan. As noted, an ILP solver or ILP solver module can be incorporated into an EDA tool.

The ILP solver can reach a solution with the results listed below.

$a_1=5$, $a_2=10$, $a_3=9$, $a_4=5$, $a_5=9$, $a_6=13$, $a_7=17$, $a_{PO}=17$, $a_{PI}=0$;
$b_3=b_5=b_6=b_7=0$, $b_2=b_4=1$; and
$m_3=m_5=m_6=m_7=0$, $m_2=m_4=1$.

Based upon the values determined for $m_i$, it can be seen that nodes N2 and N4 are to be re-assigned or re-mapped to LUTs ($m_2=m_4=1$). Nodes N1, N3, N5, N6, and N7 are re-mapped to MGs ($m_3=m_5=m_6=m_7=0$).

Figure 4:
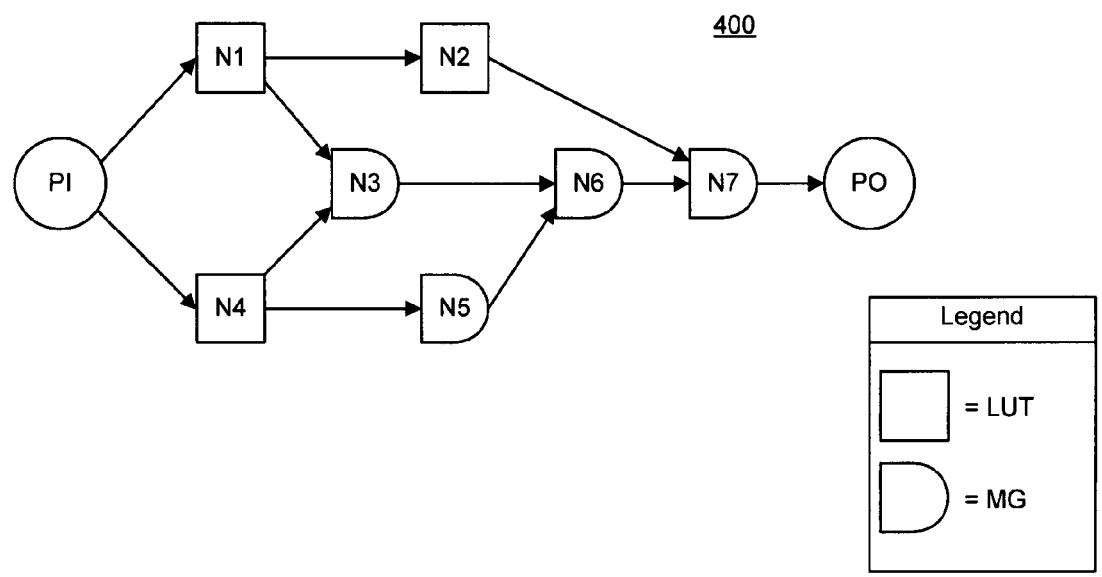
FIG. 4 is a DAG representing a circuit design after application of logic resource balancing in accordance with an embodiment of the present invention.

FIG. 4 is a DAG 400 representing a circuit design after the application of logic resource balancing in accordance with an embodiment of the present invention. More particularly, DAG 400 represents the state of the DAG of FIG. 2 after application of the ILP logic resource balancing. As shown, nodes N2 and N4 have been re-mapped to LUTs rather than MGs. The other nodes of the DAG, e.g., N1, N3, N5, N6, and N7, have been re-mapped to the same type of logic resource to which each respective node was mapped prior to the ILP formulation and solution. The resulting circuit design utilizes less logic area, since implementation requires 4 slices instead of 6.

In another embodiment, the ILP formulation can be further simplified by determining that no node located in a critical path can be re-mapped to a type of logic resource that has a larger delay than the type of logic resource to which such a node is already mapped. Re-mapping a circuit element in a critical path to a type of logic resource having a higher delay could cause the critical path to fail timing requirements. Accordingly, the binary variables $m_i$ corresponding to nodes in a critical path can be set to 0, indicating that the nodes will be re-mapped to the same type of logic resource. This assumes that the alternate type of logic resource is slower than the original type of logic resource. In any case, this can simplify the ILP formulation to be solved.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

The present invention can be realized in hardware or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. A computer-implemented method of balancing logic resource usage in a circuit design for a programmable integrated circuit, the method comprising:

determining that an assignment of circuit elements of the circuit design is unbalanced when a measure of usage of a first type of logic resource exceeds a measure of usage of an alternate type of logic resource within the programmable integrated circuit;

generating an Integer Linear Programming (ILP) formulation specifying an assignment of circuit elements to the first type of logic resource and the alternate type of logic resource, wherein the ILP formulation comprises a timing constraint that depends upon a difference between a delay of the alternate type of logic resource and the first type of logic resource;

obtaining and storing a solution for the ILP formulation within memory;

re-mapping selected circuit elements of the circuit design from the first type of logic resource to the alternate type of logic resource according to the solution for the ILP formulation; and storing the circuit design specifying the re-mapped circuit elements within memory, wherein determining that an assignment of circuit elements is unbalanced, generating an ILP formulation, obtaining and storing a solution for the ILP formulation, re-mapping selected circuit elements, and storing the circuit design are performed by a computer.

2. The computer-implemented method of claim 1, further comprising identifying each circuit element within a critical path and preventing re-mapping of that circuit element, through solving the ILP formulation, to a type of logic resource having a delay that exceeds a delay of a type of logic resource to which the circuit element is currently mapped.

3. The computer-implemented method of claim 1, further comprising restricting the first type of logic resource and the alternate type of logic resource to types of logic resources found within a same slice of the programmable integrated circuit.

4. The computer-implemented method of claim 1, further comprising first mapping logic elements of the circuit design to logic resources of the programmable integrated circuit.

5. The computer-implemented method of claim 4, further comprising packing mapped circuit elements of the circuit design into slices of the programmable integrated circuit.

6. The computer-implemented method of claim 1, further comprising:

identifying circuit elements assigned to logic resources of the first type that also are assigned to slices comprising at least one unused logic resource of the alternate type; and limiting the circuit elements considered for re-mapping in the ILP formulation to only circuit elements identified as the circuit elements assigned to logic resources of the first type that also are assigned to slices comprising at least one unused logic resource of the alternate type.

7. The computer-implemented method of claim 1, wherein generating an ILP formulation further comprises:

representing the circuit design as a directed acyclic graph (DAG) wherein nodes of the DAG represent circuit elements of the circuit design;

defining an arrival time variable for each of a plurality of nodes of the DAG;

defining a timing slack budget variable for each of the plurality of nodes of the DAG; and defining a binary variable for each of the plurality of nodes of the DAG, wherein the binary variable for each node indicates whether the node is to be re-mapped to the first type of logic resource or the alternate type of logic resource.

8. The computer-implemented method of claim 7, wherein generating an ILP formulation further comprises generating arrival time constraints, slack budget constraints, and critical path delay constraints.

9. The computer-implemented method of claim 1, wherein generating an ILP formulation further comprises defining a plurality of variables comprising binary variables, a plurality of constraints specifying relationships among selected ones of the plurality of variables, and an objective function to be minimized that depends upon a sum of selected ones of the binary variables, wherein each binary variable indicates whether an element of the circuit design is to be re-mapped to the first type of logic resource or the alternate type of logic resource.

10. A computer program product, comprising:
a computer-usable storage device storing computer-usable program code that balances logic resource usage in a circuit design for a programmable integrated circuit, the computer-usable storage device comprising:
computer-usable program code that determines that an assignment of circuit elements of the circuit design is unbalanced when a measure of usage of a first type of logic resource exceeds a measure of usage of an alternate type of logic resource within the programmable integrated circuit;
computer-usable program code that generates an Integer Linear Programming (ILP) formulation specifying an assignment of elements to the first type of logic resource and the alternate type of logic resource, wherein the ILP formulation comprises a timing constraint that depends upon a difference between a delay of the alternate type of logic resource and the first type of logic resource;
computer-usable program code that obtains a solution for the ILP formulation;
computer-usable program code that re-maps selected circuit elements of the circuit design from the first type of logic resource to the alternate type of logic resource according to the solution for the ILP formulation; and
computer-usable program code that outputs the circuit design specifying the re-mapped circuit elements.

11. The computer-program product of claim 10, wherein the computer-usable storage device further comprises computer-usable program code that identifies each circuit element within a critical path and prevents re-mapping of that circuit element, through solving the ILP formulation, to a type of logic resource having a delay that exceeds a delay of a type of logic resource to which the circuit element is currently mapped.

12. The computer-program product of claim 10, wherein the computer-usable storage device further comprises computer-usable program code that restricts the first type of logic resource and the alternate type of logic resource to be logic resources available within a same slice of the programmable integrated circuit.

13. The computer-program product of claim 10, wherein the computer-usable storage device further comprises:
computer-usable program code that maps circuit elements of the circuit design to logic resources of the programmable integrated circuit; and
computer-usable program code that packs mapped circuit elements of the circuit design into slices of the programmable integrated circuit.

14. The computer-program product of claim 13, wherein the computer-usable storage device further comprises:
computer-usable program code that identifies circuit elements assigned to logic resources of the first type that also are assigned to slices comprising at least one unused logic resource of the alternate type; and
computer-usable program code that limits the circuit elements considered for re-mapping in the ILP formulation to circuit elements identified as the circuit elements assigned to logic resources of the first type that also are assigned to slices comprising at least one unused logic resource of the alternate type.

15. The computer-program product of claim 10, wherein the computer-usable program code that generates an ILP formulation further comprises computer-usable program code that defines a plurality of variables comprising binary variables, a plurality of constraints specifying relationships among selected ones of the plurality of variables, and an objective function to be minimized that depends upon a sum of selected ones of the binary variables, wherein each binary variable indicates whether an element of the circuit design is to be re-mapped to the first type of logic resource or the alternate type of logic resource.

16. The computer-program product of claim 10, wherein the computer-usable program code that generates an ILP formulation further comprises:
computer-usable program code that represents the circuit design as a directed acyclic graph (DAG) wherein nodes of the DAG represent circuit elements of the circuit design;
computer-usable program code that defines an arrival time variable for each of a plurality of nodes of the DAG;
computer-usable program code that defines a timing slack budget variable for each of the plurality of nodes of the DAG; and
computer-usable program code that defines a binary variable for each of the plurality of nodes of the DAG, wherein the binary variable for each node indicates whether the node is to be re-mapped to the first type of logic resource or the alternate type of logic resource.

* * * * *